United States Patent [19]
Berry, Jr. et al.

[11] Patent Number: 5,375,091
[45] Date of Patent: Dec. 20, 1994

[54] METHOD AND APPARATUS FOR MEMORY DYNAMIC BURN-IN AND TEST

[75] Inventors: Robert W. Berry, Jr., Round Rock; Bernd K. F. Koenemann, Hopewell Junction, N.Y.; William J. Scarpero, Jr., Poughkeepsie, N.Y.; Philip G. Shephard, III, Wappingers Falls, N.Y.; Kenneth D. Wagner, Sunnyvale, Calif.; Gulsun Yasar, Poughkeepsie, N.Y.

[73] Assignee: International Business Machines Corporation, Armonk, N.Y.

[21] Appl. No.: 163,803

[22] Filed: Dec. 8, 1993

[51] Int. Cl.⁵ ............................................. G11C 13/00
[52] U.S. Cl. .................................. 365/201; 371/10.1; 371/11.1; 371/21.2
[58] Field of Search .............. 365/201; 371/10.1, 21.1, 371/21.2, 10.2, 10.3, 11.1, 11.3

[56] References Cited

U.S. PATENT DOCUMENTS

| | | |
|---|---|---|
| 4,544,882 | 10/1985 | Flora . |
| 4,585,955 | 4/1986 | Uchida ............... 365/201 |
| 4,639,919 | 1/1987 | Chang et al. . |
| 4,841,485 | 6/1989 | Prilik et al. . |
| 4,871,963 | 10/1989 | Cozzi . |
| 4,872,168 | 10/1989 | Aadsen et al. . |
| 5,101,409 | 3/1992 | Hack . |
| 5,138,619 | 8/1992 | Frasang et al. . |

OTHER PUBLICATIONS

Bardell, P. H. et al., "Self-Test of Random-Access Memories," IBM Technical Disclosure Bulletin, vol. 26, No. 1, Jun. 1983, pp. 336-340.

Cha, C. W. et al., "Array Test Pattern Generation Algorithms for a Per Pin Tester," IBM Technical Disclosure Bulletin, vol. 30, No. 10, Mar. 1988, pp. 116-122.

*Primary Examiner*—Terrell W. Fears
*Attorney, Agent, or Firm*—Lynn L. Augspurger; Peter Visserman

[57] ABSTRACT

A memory embedded in a integrated processor chip is dynamically stressed tested by repeatedly writing a test pattern to the data locations of the memory in which a high percentage of the memory cells are sequentially written with complementary data in order to create a high stress on the memory devices. The test pattern is generated as a function of the number of address locations of the memory and the number of data bits of a memory data word. The test pattern is rotated each time the memory is addressed. The test pattern preferably has a contiguous group of digits with the number of digits in the contiguous group being a function of the number of address locations and the number of data bits in the memory word. The memory data input register is configured as a recirculating loop and additional dummy bits are added to provide recirculating loops longer than the data input register. A plurality of independent circulating loops may be created in the data input register or in combination with a number of dummy register bits.

22 Claims, 1 Drawing Sheet

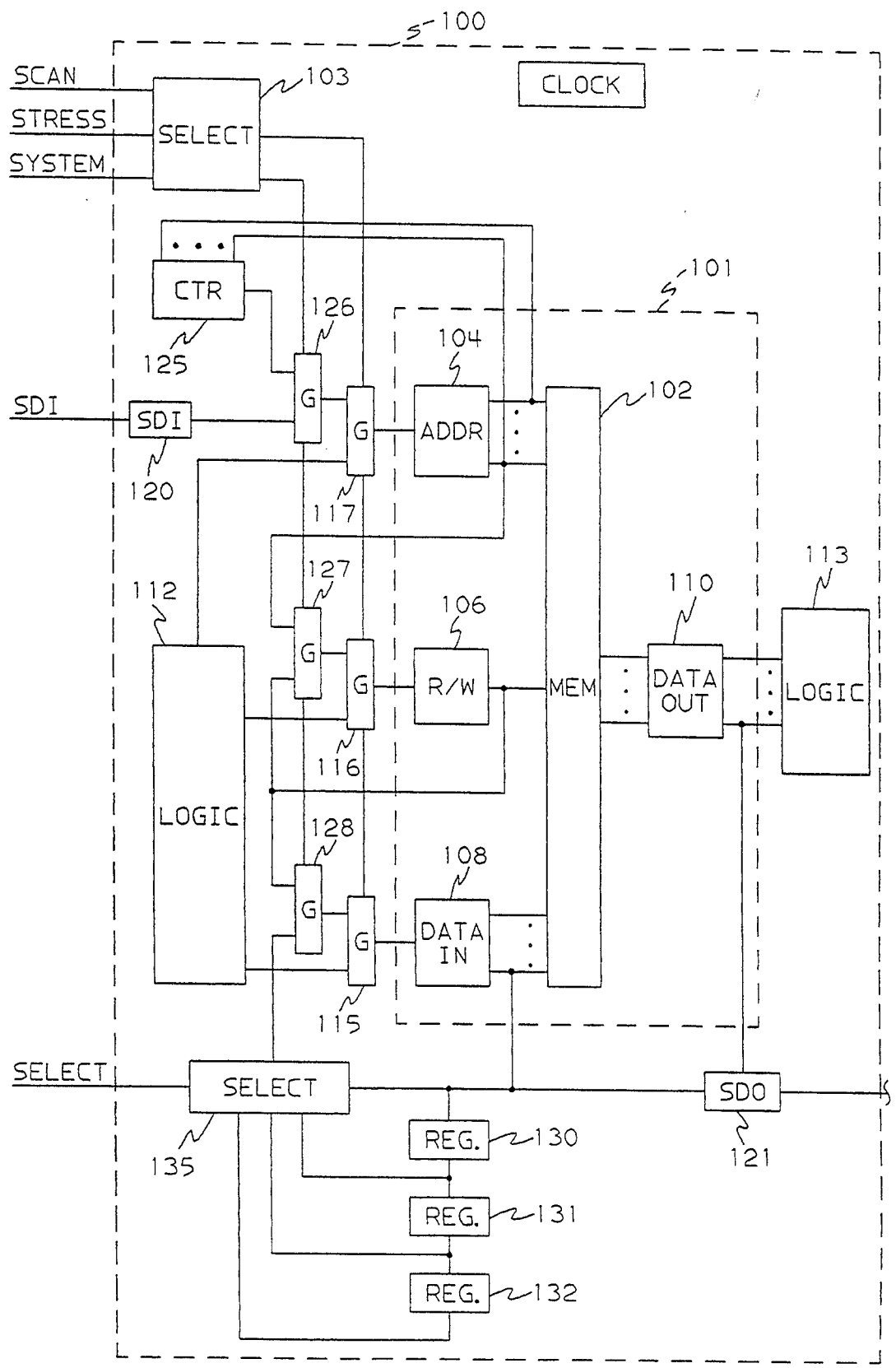

METHOD AND APPARATUS FOR MEMORY DYNAMIC BURN-IN AND TEST

BACKGROUND OF THE INVENTION

The invention relates generally to improved methods and apparatus for exercising and testing memory devices, and, more particularly, to burn-in and tests of integrated circuit memories.

It is well recognized that failures in integrated circuit and electronic devices tend to occur in the first part of the life cycle. Furthermore, the repair or replacement of integrated circuits in assembled systems in the field is expensive both from the point of view of performance of the repair and from the significant system down-time which may result as well as from errors which may have been introduced in the system because of the failed part. To reduce the number of failures in newly installed systems, it is not uncommon to exercise the device at an elevated temperature or, in what is known as a burn-in operation, before the device is assembled into a system, in addition to performing standard operational tests on the device.

The purpose of the burn-in operation is not only to test the operability of the device, but to exercise and stress the circuitry in order to allow the circuitry to mature and to cause the failure of any circuits which are only marginally operable and which will fail in the early part of the life cycle. Prior art testing arrangements typically apply randomly generated data words to a memory for burn-in and test purposes with the assumption that the majority of all possible combinations, which could cause failures, will be generated. It is recognized that a greater stress is applied to the memory devices when the memory devices are written sequentially by a selected data bit and its complement in order to switch the circuits more often. One prior art patent, U.S. Pat. No. 5,138,619 describes the application of randomly generated test pattern to a number of address locations of a memory device followed by applying the complemented test pattern in order to provide maximum stress on the memory device. A problem, however, with this prior art arrangement and all other prior art arrangements that apply randomly generated test patterns is that there is no assurance that a specific pattern, such as consecutive 0's and 1's for all combinations of bits, will be generated. In order to increase the probability that all desired patterns will be generated, the test cycle may be increased. However, not all bits may be switched with the same frequency for the purpose of stimulating failures in weak devices.

In large scale integrated circuitry, it is not uncommon to use built-in self tests (BIST) circuits for operational and burn-in testing which often include pseudo-random pattern generators as well as complex state machine logic circuitry and the necessary analysis circuitry to determine pass or failure of the test. A problem with BIST systems is the costs of the additional circuitry in terms of silicon real estate and the attendant concern for failures in the test circuitry itself. It is an object of the invention to provide a test arrangement generating optimum burn-in or test patterns which can be repeatedly applied and at high speed and which will perform specific tests such as testing for the influence of adjacent bits when written concurrently. It is a further object of the invention to be able to provide a test system in which a selected test pattern can be repeatedly applied and be complemented with minimal hardware addition to the integrated circuitry.

SUMMARY OF THE INVENTION

These and other problems of the prior art are solved in accordance with the principles of this invention by the addition of minimal control hardware to an integrated circuit device in order to test the embedded memory, making use of the memory access circuitry provided in the device. In accordance with one aspect of the invention, access circuitry is provided which allows special access to the memory for test purposes and allows selected bit patterns to be applied to the memory cells.

In accordance with another aspect of the invention, testing of a memory device includes the step of generating a test pattern as a function of the number of address locations of a memory under test and the number of data bits of a memory location. Each of a plurality of memory locations is written repeatedly and the data word to be written is rotated in successive writing operations. Advantageously, the selected pattern causes a high percentage of memory cells to be sequentially written with complementary data in order to create a high stress on the memory devices.

In accordance with another aspect of the invention, the test pattern consists of a group of contiguous binary digits of the same value (e.g., a group of contiguous ones) and the number of contiguous digits in the group is a function of the number of address locations in the memory to be tested and the number of data bits of the memory locations.

In one particular embodiment of the invention, the test pattern is rotated in a recirculating loop of a length equivalent to the length of the memory data word. Furthermore, the test pattern may be circulated in a recirculating loop of a length greater than the length of the memory data word and wherein the length of the recirculating loop is a function of the number of contiguous digits of a selected binary value in the test pattern.

In accordance with a further aspect of the invention, test patterns are rotated in a plurality of independent recirculating loops and each of the recirculating loops has a length which is defined as a function of the number of memory addresses and the number of contiguous digits in the test pattern.

In accordance with another aspect of the invention, the test pattern is rotated in the data input register of the memory to be tested and a dummy register of a limited number of bits is used to extend the system input register to provide optimum complementing of a selected bit pattern.

BRIEF DESCRIPTION OF THE DRAWING

An embodiment of the invention is described in the following paragraphs with reference to the drawing which is a schematic block diagram representation of an integrated circuit device incorporating principles of the invention.

DETAILED DESCRIPTION

The drawing is a block diagram representation of an integrated circuit chip 100 with an embedded memory 101. The embedded memory includes a memory array 102, as well as an address register 104, a read/write circuit 106, a data input register 108, and a data output register 110. Combinatorial logic circuitry 112 provides input data, read/write control signals and address signals to the memory via control gates 115, 116 and 117, respectively. Combinatorial logic circuitry 113 receives data read from the memory when the device is operated in the normal system mode. Also shown in FIG. 1 is a scan data input register 120 and a scan data output register 121. These are used in what is known as the scan design, which is standard in many integrated circuit chips.

In the scan mode, scan data is serially supplied to the address register 104 and shifted through the read/write circuit 106 to the data input register 108. To accommodate the scan mode, the address register 104 and the data input register 108 have been formed as shift registers. Control gates 126 through 128 allow the interconnection between the address register, the read/write circuit, and the data and register under control of a select circuit 103 in order to accommodate this scan mode loading scheme. In accordance with this invention, an additional mode of operation, referred to as the stress mode, has been made available and a stress input has been provided to the select circuit 103 for the appropriate control of control gates 115 through 117 and 126 through 128. For operation in the stress mode, the system is initialized using the scan mode and the scan data-in register 120 is used to store a selected bit pattern in the data register 108 and an initial address in the address register 104. When in the stress mode, the read/write circuit 106 is held in the write position by a feedback loop, via control gate 127. This allows for continuous write operation to the memory for the purpose of stressing the memory devices. Dummy registers 130, 131, and 132 are added for use in the stress mode and are connected to the data-in register 108 to form an extension of this register for the purpose of producing a recirculating loop with this register. The output of the data register and of each of the dummy registers is connected via a select circuit 135 and control gates 128 and 115 to the data register 108 by selectively feeding back the output from either the register 108 and one of the dummy registers 130 through 132, the contents of the register, with or without the dummy registers is selectively rotated. The manner in which in data input where a bit pattern is selected, and the desired length of the recirculating loop, are discussed later herein.

A primary objective of the method and apparatus of the invention is to exercise the embedded memory to stimulate failures typically occurring at early stages of the life cycle of the device. For test purposes, to determine whether the proper output is produced in response to the writing of a certain date word in memory, signature generation circuits may be added which allow the comparison of the data word written to the memory with that received from the memory in a known fashion. For the sake of clarity of the drawing, the signature analyzing circuitry is not shown.

In accordance with this invention, an initialization pattern is selected by a predefined method to obtain an optimum number of complemented bits, resulting in memory cell switching or inversion, for memory dynamic burn-in. In the present embodiment, the memory locations are written in consecutive sequence by periodically incrementing the address and by rotating the data bits in the data-in register by one bit each time before a next writing operation. In this manner, consecutive address locations receive different data bit patterns. For optimum burn-in, the data applied to a particular address is preferably the complement of the data previously written therein. Thus, the data initialization pattern should be such that a maximum number of the bits in the pattern are complemented the next time the same address location is written. It has been found that an optimum pattern for obtaining the largest number of complements is a function of the number of addresses locations of the memory and the number of bits per address location. The number of consecutive zeros or ones in a continuous group of bits of the same value for the optimum initialization pattern may be determined from the equation $k = |M - n(N)|$ for the case where the number of addresses M is greater than the number data bits N in a memory data word. n is an integer such that the value k is less than (N/2).

By way of example, where M=32 and N=31, the value of k is equal to 1. This shows that the maximum stimulation initialization pattern for a 31 bit register loop circulated through a series of 32 address is alternating ones and zeros. The percentage of complemented bits may be calculated by the equation $100(N-k)/N$ when N/k is such that the quotient Q is odd and the remainder R is zero. For all other cases of the quotient Q and the remainder R, the percentage of complemented bits is $100(N-R)/N$. In the above example, where M=32 and N=31, the quotient Q is odd and the remainder R=0 for the division N/K. Thus, the percentage of bits complemented, as computed by the equation $100(N-k)/N$, is 96.8%. In the above example, even if the number of bits in the data word written to memory is reduced to 30, the complemented data percentage stays the same as long as the recirculating data-in register loop is 31 bits long. This is physically accomplished in the circuit shown in the drawing by taking the end of the recirculating loop from the first dummy register 130 and writing 30 bits to the memory. The above example using a bit pattern of alternating 0's and 1's (e.g. 0101010-) is contrasted with the case of the bit pattern in the data-in register consists of alternating pairs of 0's and 1's (e.g. 00110011--) and where number of addresses M=16 and the number of data bits N=9. The alternating 0's and 1's bit pattern, as the bit pattern as the data in register is rotated with each address increment, is shown as Example 1 in Table A. A comparison of the bit patterns, as they are written in the same address location in two consecutive passes, shows that only two bits out of nine of Example 1 are complemented or approximately 22%. A pattern of consecutive pairs of 1's , 0's in a system of 16 addresses using 9 data bits is shown as Example 2 in Table A. The pattern of Example 2 will yield approximately 88% complemented data as calculated by the above equation. It is apparent that vastly different complemented data percentages are obtained with the different bit patterns.

TABLE A

| | PATTERN | | | |
| | Example 1 | | Example 2 | |
| ADDRESS | S | S + 1 | S | S + 1 |
|---|---|---|---|---|
| 0000 | 010101010 | 010101001 | 011001100 | 100110001 |
| 0001 | 001010101 | 101010100 | 001100110 | 110011000 |
| 0010 | 100101010 | 010101010 | 000110011 | 011001100 |
| 0011 | 010010101 | 001010101 | 100011001 | 001100110 |
| 0100 | 101001010 | 100101010 | 110001100 | 000110011 |
| 0101 | 010100101 | 010010101 | 011000110 | 100011001 |
| 0110 | 101010010 | 101001010 | 001100011 | 110001100 |
| 0111 | 010101001 | 010100101 | 100110001 | 011000110 |
| 1000 | 101010100 | 101010010 | 110011000 | 001100011 |
| 1001 | 010101010 | 010101001 | 011001100 | 100110001 |
| 1010 | 001010101 | 101010100 | 001100110 | 110011000 |
| 1011 | 100101010 | 010101010 | 000110011 | 011001100 |
| 1100 | 010010101 | 001010101 | 100011001 | 001100110 |

TABLE A-continued

| | PATTERN | | | |
|---|---|---|---|---|
| | Example 1 | | Example 2 | |
| ADDRESS | S | S + 1 | S | S + 1 |
| 1101 | 101001010 | 100101010 | 110001100 | 000110011 |
| 1110 | 010100101 | 010010101 | 011000110 | 100011001 |
| 1111 | 101010010 | 101001010 | 001100011 | 110001100 |

Considering a second example, in which the number of addresses is 2,048 and the number of data bits of the recirculating data-in register is 35, the optimum stimulation initialization pattern is found to contain 17 consecutive zeros or ones. The percentage of complemented bits in that case, where the quotient of N/k is even and the remainder is non-zero, is 97.1%.

A different method of computing the desired number of consecutive ones or zeros is used to obtain an optimum stimulation initialization pattern in the case where the number of addresses M is less than the number of data bits N. In the event that (N−M) is greater than M/2, the consecutive number of zeros or ones, k, in the initialization pattern equals M, i.e., the number of addresses. The percentage of complemented bits is computed as 100[N−(M−R)]/N where R is the remainder of N divided by M. By way of example, in a memory of 8 address locations, each having 31 data bits, the near maximum stimulation initialization pattern is eight consecutive ones or eight consecutive zeros, and the percentage of complemented bits is 96.8%.

In the case where M is less than N and (N−M) is less than or equal to M/2, the method of generating the near maximum stimulation pattern includes the step of starting from the least significant to the most significant bits, or vice versa, repeating groups of k=(N−M) length of zeros or ones. The percentage of bits complemented is calculated by the equation 100 [N−(k−R)]/N where R is the remainder of the division N/(N−M). By way of example, when the number of addresses M=18 and the number of data bits N=25, the number of consecutive ones or zeros k, starting from the least significant bit position, equals N−M=7. R=4 and the percentage of complemented data bits in that case is 100 [25−(7−4)]/25=88%.

As described in the preceding paragraphs, semiconductor memories may be exercised with selected odd-bit length initialization patterns which provide near maximum stimulation for burn-in purposes. In accordance with this invention, one or more dummy register stages are added to the memory input data-in register to configure the input data-in register as a recirculating loop of odd or even length in order to accommodate various preferred initialization patterns. Additionally, the memory input data register may be divided into a number of smaller recirculating loops to accommodate preferred initialization patterns. It is not always necessary to have odd length recirculating loop in order to find an initialization pattern with a high percentage of complementary data. An initialization pattern solution always exists when the recirculating loop is relatively prime to the number of memory addresses. An odd length recirculating loop will always have a length relatively prime to the number of memory addresses in a conventional memory, where the number of addresses is a power of two.

The method for determining the desired length of a recirculating loop to generate a preferred data pattern includes the following steps:

1. Find all the factors of (M−k) and (M+k) where M is the number of addresses in the memory address range and k is the desired number of consecutive zeros or ones in the preferred data initialization pattern.
2. Select L, the length of the recirculating loop, equal to one of the factors of (M−k) or (M+k) that is equal to or larger than N and closest in value to N.
3. Add L−N=d dummy registers to a data-in register of length N to obtain a recirculating data-in register of length N+k.
4. In the event that no factors are found in step 2 which are equal to or larger than N, or if the number of dummy registers to be added, found in step 3, is undesirably high, divide the input data register into two or more recirculating loops such that length of each of the loops is equal to a factor found in step 2.

If necessary, dummy registers may be added to complete a recirculating loop selected in step 4. A single, relatively large, recirculating loop is preferred since the percent of complementary data written to a memory cell usually decreases as the length of the loop decreases. Selecting a factor of (M−k) or (M+k), in step 2, which is larger than the one closest in value to N, will increase the percentage of complemented bits. However, it will be more costly in terms of additional dummy registers. This is demonstrated by examples in subsequent paragraphs.

The percentage of cells flipped or the complemented data written is calculated as follows:

Percentage of cells flipped=100(L−k)/L, when the values of L and k are such that the quotient Q of L/k is odd and the corresponding remainder R is equal to zero. For all other values of the quotient Q and the remainder R, the percentage of data cells complemented equals 100(L−R)/L.

By way of example, suppose that the number of addresses M=32,768 and the number of data bits N=4 and suppose that the preferred pattern is a checkerboard pattern of alternating zeros and ones. Thus, the number of consecutive 0's, or 1's, k=1 and the factors of (M−k) and (M+k) include 7, as well as 3, 9, 11 and others. The factor which is closest to and larger than N is 7. Accordingly, the number of dummy registers to be added is equal to 3, making the total number of recirculating loop bits L=7. Since the quotient of L/k is odd and the remainder is zero, the percentage of complementary data written to the cells is 85.7%.

Assuming that the factor 9 had been chosen in the previous example instead of the factor 7, then the loop length L=9 and the calculated percentage of complemented data written to the same cell location would be 88.9 instead of the 85.17 computed previously. Thus, this example shows that the percentage of complemented data written to the same address increases as the length of the loop is increased. Further illustrating the invention by means of another example, assume that the number of addresses M=128 and the number of bits per data word is N=80 and a preferred bit pattern of two consecutive zeros is used. In that case, M=128 and k=2. The factors of (M−k) and (M+k) include 18, 42 and 63. The 80 bit input data register may be divided into two circulating loops, such that the length of each circulating loop is one of the factors and the sum of the selected factors is greater than N=80. Thus, factors 63 and 18 can be chosen or factor 42 can be chosen for the length of each of two loops. If data in register loops of lengths 18 and 63 are chosen, one additional stage will be added and the percentage of data bits complemented on successive writings to a memory location is 98.4% for the 63 bit loop and 88.9% for the 18 bit loop. If the two 42 bit loops are chosen, four additional stages will have to be added and for the selected initialization pattern (k=2), 95.2% of the data will be complemented on successive writing applications to the same memory location.

In the immediately preceding paragraphs, a method for determining the length of the data-in register recirculating loop for a selected initialization pattern was discussed for the case where the number of addresses M is greater than the number of bits N in the memory data word. For the case where the number of memory addresses M is less than the number of data bits N, the following steps are used to determine a desired length of a data-in register recirculating loop for a particular initialization pattern. The steps are as follows:

1. Multiply (M−k) and (M+k) with whole numbers such that the products will be equal to N; if not equal to N, such that the products will be closest to N but not smaller than N; where k equals the number of consecutive zeros or ones in the initialization pattern.
2. Select the product equal to N or, if none is equal to N, the product closest to N but not smaller than N.
3. Set the length L of the data input recirculating loop equal to the larger multiplication factor of the selected product and set the number of recirculating loops S equal to the smaller multiplication factor of the selected product.
4. Set the required number of dummy stages d, equal to |N−L×S|.
5. Compute the number of bits per circulating loop Y, equal to (N+d)/S.

The percentage of data complemented on successive writes to the same location is derived as follows: If the quotient Q of L/k is even and the remainder R is equal to zero, the percentage of complemented data is 100%. For all other values of Q and R, the percentage is 100(L−(k−R))/L.

By way of example, suppose that the number of addresses M is equal to 8 and the number of data bits N is equal to 30 and that the desired initialization pattern consists of two consecutive zeros following by two consecutive ones. Therefore, k=2. Accordingly, M−k=6 and M+k=10. Products of 6 and 10 that are equal to 30 are 6×5 and 10×3. The largest multiplication factor 10 and its multiplicand is 3. Accordingly, the length L of the recirculating loops is equal to 10 and the number of recirculating loops S is equal to 3. Thus, the number of additional stages needed d=N−L×S=0. The quotient Q of L/k is odd and the remainder R=0. Therefore, the percentage of data complemented is 100(10−2)/10=80% with the selected initialization pattern.

By way of a further example, assume that the number of addresses M is 32 and the length of the data word N is 60 and the selected pattern consists of alternating zeros and ones. Thus, k=1. In that case, M−k=31 and M+k=33. Multiples of 31 and 33 that are closest to 60 are 62 and 66, respectively. 62 is selected since it is closest to 60. Accordingly, the loop length L is 31 and the number of loops is 2. The number of additional registers needed d=|N−L×S|=2. Hence, two dummy registers are required. The quotient of L/k is odd and the remainder R=0. Accordingly, the percentage of data complemented on successive writes to the same location is defined by the equation 100(L−(k−R))/L or 96.8%.

It will be understood that the above-described arrangements are merely illustrative of the application of the principles of the invention and that various other arrangements may be devised by those skilled in the art without departing from the spirit and scope of the invention.

What is claimed is:

1. A method of selectively stress testing memory cells of an integrated circuit memory having a predefined number of memory address locations storing data words of a predefined number of data bits, the method comprising the steps of:
    A) generating a test pattern as a function of the predefined number of address locations and the predefined number of data bits;
    B) storing the test pattern in a data input register and storing a selected memory address in an address register;
    C) writing the test pattern from the data input register to the memory address location defined in the address register;
    D) rotating the test pattern stored in the data input register;
    E) storing a next address in the address register
    F) repeating steps C through E a selected number of times.

2. The method in accordance with claim 1 wherein the step of generating a test pattern comprises generating a test pattern having a number of contiguous digits of a first binary value and a number of contiguous digits of a second binary value complementary to the first binary value and wherein the number of contiguous digits of the first binary value is a function of the predefined number of memory address locations and the number of data bits.

3. The method in accordance with claim 2 wherein the step of generating a test pattern comprises generating a data pattern wherein the number of contiguous digits of the first binary value is a function of the absolute value of the difference between the predefined number of address locations and an integral multiple of the predefined number of data bits.

4. The method in accordance with claim 2 wherein the step of generating a test pattern comprises generating a data pattern wherein the number of contiguous digits of the first binary value is equal to the absolute value of the difference between the predefined number of address locations and an integral multiple of the predefined number of data bits.

5. The method in accordance with claim 1 wherein the step of rotating comprises rotating the test pattern in a recirculating loop of predefined length.

6. The method in accordance with claim 5 wherein the step of rotating the test patterns in a recirculating loop comprises rotating the test pattern in a memory data input register having a predefined number of bit locations corresponding to the predefined number of data bits.

7. The method in accordance with claim 6 wherein the step of rotating the test pattern in a recirculating loop comprises rotating the test pattern through at least one additional bit location.

8. The method in accordance with claim 5 and further comprising the step of defining the length of the recirculating loop as function of the predefined number of memory address locations.

9. The method in accordance with claim 8 wherein the step of generating a test pattern comprises the step of defining the length of the recirculating loop as a function of the number of contiguous digits of a selected binary value in the test pattern.

10. The method in accordance with claim 9 wherein the step of defining includes defining the length of the recirculating loop to correspond to a multiplication factor of a number derived as the sum of the number defining the contiguous digits and the predefined number of addresses.

11. The method in accordance with claim 1 wherein the step of rotating comprises rotating the test pattern in a plurality of independent recirculating loops in the data input register.

12. The method in accordance with claim 11 wherein each of the recirculating loops has a length which is defined as a function of the predetermined number of addresses.

13. The method in accordance with claim 12 wherein the length of each of the recirculating loops is further defined as the number of contiguous digits of a selected value in the test pattern.

14. The method in accordance with claim 13 wherein the length of each of the recirculating loops corresponds to a multiplication factor of a number derived as the sum of the number defining the contiguous digits and the predefined number of addresses.

15. The method in accordance with claim 11 and further comprising the step of adding at least one dummy register to data input register and the step of selecting one of the recirculating loops such that the selected loop extends beyond the data input register and includes at least one dummy register.

16. The method in accordance with claim 1 wherein the step of generating a test pattern comprises generating a test pattern having a number of contiguous digits of a first binary value and a number of contiguous digits of a second binary value complementary to the first binary value and wherein the number of contiguous digits of the first binary value is a function of the predefined number of memory address locations.

17. The method in accordance with claim 16 wherein the number of contiguous digits of the first binary number equals the predefined number of memory address locations.

18. The method in accordance with claim 1 wherein the test pattern comprises a number of contiguous bits of a first binary value and a number of contiguous bits of a second binary value complementary to the first binary value and wherein the step of rotating comprises rotating the test pattern in a recirculating loop of a length which is a multiplication factor of a number defined as the product of a first number which is a function of the sum of the number of contiguous digits of the first binary value and the predefined number of address locations, and a second number which is a function of the difference between the number defining the number of contiguous digits of the first binary value and the predefined number of address locations.

19. An integrated circuit chip comprising:
an embedded memory device;
memory address generating circuitry connected to the memory device operative to periodically apply a modified memory address to the memory;
a data input register circuit connected to the memory to provide data to be written in the memory and operative as a shift register, the shift register having a number of register bit positions corresponding to the length of a memory data word and at least one additional bit position, the shift register circuit operative to periodically rotate a data word through the full length of the shift register circuit, including the additional bit position, and to write the rotated data word to the memory.

20. The integrated circuit chip in accordance with claim 19 wherein the shift register circuit comprises a plurality of the additional bit positions.

21. The integrated circuit chip in accordance with claim 19 and further comprising select circuitry operative to selective supply a signal from one of the register bit positions or form one of the additional bit positions to an input of the shift register circuit to enable data stored in the shift register circuitry to be selectively rotated through a variable bit length loop.

22. The integrated circuit chip in accordance with claim 19 and further comprising read/write control circuitry and mode control circuitry selectively controlling the read/write circuitry to repeatedly write data to memory and to control the data input register circuit to write to a next memory location a data word rotated by at least one bit position from a data word written to a previously written memory location.

* * * * *